United States Patent
Folkmann et al.

(10) Patent No.: US 9,276,784 B2
(45) Date of Patent: Mar. 1, 2016

(54) FREQUENCY SELECTIVE PREDISTORTION

(71) Applicant: RF Micro Devices, Inc., Greensboro, NC (US)

(72) Inventors: Andrew F. Folkmann, Cedar Rapids, IA (US); Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/548,129

(22) Filed: Nov. 19, 2014

(65) Prior Publication Data

US 2015/0139359 A1 May 21, 2015

Related U.S. Application Data

(60) Provisional application No. 61/906,222, filed on Nov. 19, 2013.

(51) Int. Cl.
| | |
|---|---|
| H04K 1/02 | (2006.01) |
| H04L 25/03 | (2006.01) |
| H04L 25/49 | (2006.01) |
| H04L 25/08 | (2006.01) |
| H03F 3/19 | (2006.01) |
| H03F 3/24 | (2006.01) |
| H03F 1/32 | (2006.01) |
| H03F 1/02 | (2006.01) |

(52) U.S. Cl.
CPC ............. *H04L 25/08* (2013.01); *H03F 1/0211* (2013.01); *H03F 1/0261* (2013.01); *H03F 1/0266* (2013.01); *H03F 1/3247* (2013.01); *H03F 3/19* (2013.01); *H03F 3/245* (2013.01); *H03F 2200/102* (2013.01); *H03F 2201/3215* (2013.01); *H03F 2201/3227* (2013.01)

(58) Field of Classification Search
CPC ...... H03F 1/3247; H03F 1/3258; H03F 3/189
USPC ......................................... 375/295, 296, 297
See application file for complete search history.

(56) References Cited

U.S. PATENT DOCUMENTS

| | | | |
|---|---|---|---|
| 7,541,959 B1* | 6/2009 | Mathis et al. .................. 341/155 |
| 2003/0063686 A1* | 4/2003 | Giardina et al. ............... 375/296 |
| 2007/0223718 A1* | 9/2007 | Felder et al. .................... 381/74 |
| 2012/0034887 A1* | 2/2012 | McCallister et al. ....... 455/127.1 |
| 2013/0072139 A1* | 3/2013 | Kang et al. .................. 455/114.3 |
| 2014/0065989 A1* | 3/2014 | Mclaurin .................... 455/114.3 |
| 2014/0300426 A1* | 10/2014 | Mu et al. ....................... 332/103 |

* cited by examiner

*Primary Examiner* — Freshteh N Aghdam
(74) *Attorney, Agent, or Firm* — Withrow & Terranova, P.L.L.C.

(57) ABSTRACT

A baseband PA predistortion module, which includes a baseband combiner, a baseband PA correction circuit, and a baseband filter, is disclosed. The baseband PA correction circuit replicates behavior of an RF PA by processing a modulation data signal to provide a predistortion data signal. The behavior of the RF PA includes distortion. The modulation data signal is representative of an RF input signal to an RF PA and the predistortion data signal is representative of a correction needed at an output of the RF PA. The baseband filter receives and filters the predistortion data signal to provide a reduced predistortion data signal, such that a low frequency content of the reduced predistortion data signal is less than a low frequency content of the predistortion data signal. The baseband combiner receives and combines the modulation data signal and the reduced predistortion data signal to provide a baseband transmit signal.

18 Claims, 11 Drawing Sheets

FREQUENCY SELECTIVE PREDISTORTION

RELATED APPLICATIONS

This application claims the benefit of U.S. provisional patent application No. 61/906,222, filed Nov. 19, 2013, the disclosure of which is incorporated herein by reference in its entirety.

FIELD OF THE DISCLOSURE

Embodiments of the present disclosure relate to radio frequency (RF) communications systems, which may include RF front-end circuitry, RF transceiver circuitry, RF amplifiers, direct current (DC)-DC converters, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, efficient, and conforms to wireless communications standards.

SUMMARY

A baseband power amplifier (PA) predistortion module, which includes a baseband combiner, a baseband PA correction circuit, and a baseband filter, is disclosed. The baseband PA correction circuit replicates behavior of an RF PA by processing a modulation data signal to provide a predistortion data signal. The behavior of the RF PA includes distortion. The modulation data signal is representative of a radio frequency (RF) input signal to the RF PA and the predistortion data signal is representative of a correction needed at an output of the RF PA if the RF PA is uncorrected for distortion. The baseband filter receives and filters the predistortion data signal to provide a reduced predistortion data signal, such that a low frequency content of the reduced predistortion data signal is less than a low frequency content of the predistortion data signal. The baseband combiner receives and combines the modulation data signal and the reduced predistortion data signal to provide a baseband transmit signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A baseband PA predistortion module, which includes a baseband combiner, a baseband PA correction circuit, and a baseband filter, is disclosed. The baseband PA correction circuit replicates behavior of an RF PA by processing a modulation data signal to provide a predistortion data signal. The behavior of the RF PA includes distortion. The modulation data signal is representative of an RF input signal to an RF PA and the predistortion data signal is representative of a correction needed at an output of the RF PA if the RF PA is uncorrected for distortion. The baseband filter receives and filters the predistortion data signal to provide a reduced predistortion data signal, such that a low frequency content of the reduced predistortion data signal is less than a low frequency content of the predistortion data signal. The baseband combiner receives and combines the modulation data signal and the reduced predistortion data signal to provide a baseband transmit signal.

Figure 1:
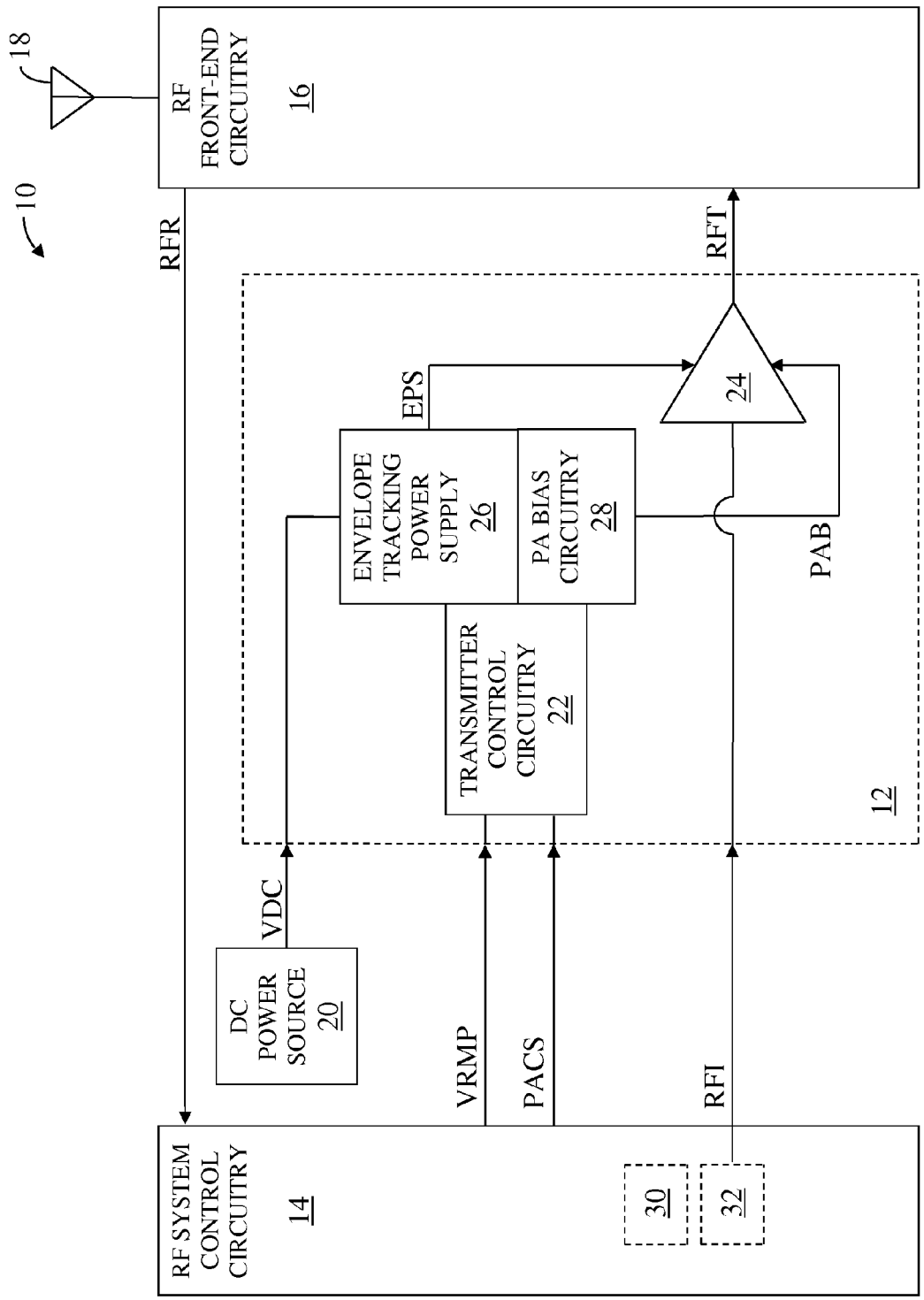
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20.

The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF transmitter circuitry 12, the envelope power supply signal EPS provides envelope tracking by providing power for amplification and at least partially envelope tracking the RF transmit signal RFT. In an alternate embodiment of the RF transmitter circuitry 12, the envelope power supply signal EPS provides average power tracking by providing power for amplification and staying about constant for a given output power from the RF PA 24. In one embodiment of the RF system control circuitry 14, the RF system control circuitry 14 includes a baseband PA predistortion module 30 and an RF modulator 32. The RF modulator 32 provides the RF input signal RFI.

Figure 2:
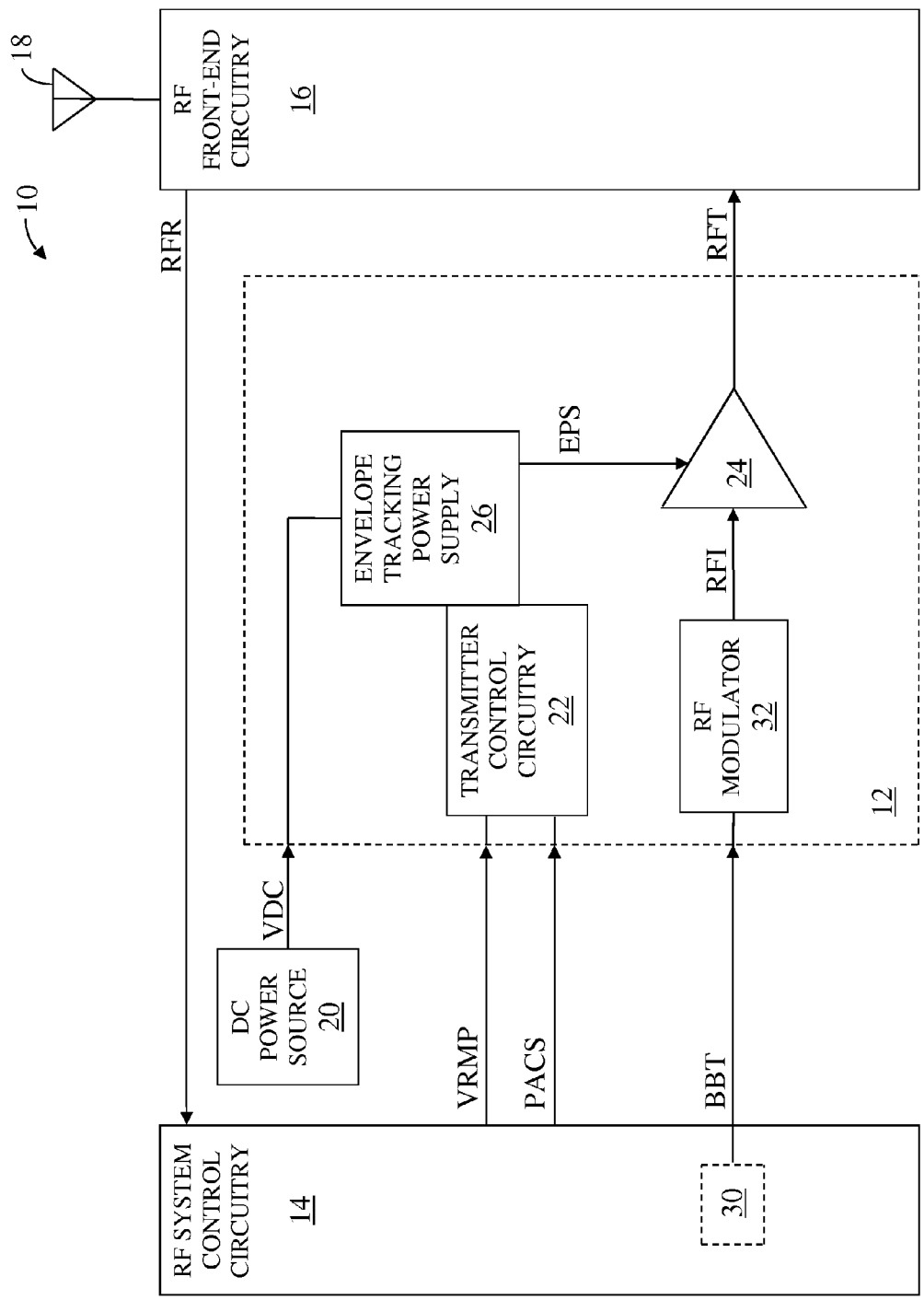
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1; except in the RF communications system 10 illustrated in FIG. 2, the RF transmitter circuitry 12 further includes the RF modulator 32, which is omitted from the RF system control circuitry 14. Additionally, the PA bias circuitry 28 and the PA bias signal PAB are not shown so as to simplify FIG. 2.

The baseband PA predistortion module 30 provides a baseband transmit signal BBT to the RF modulator 32. The baseband transmit signal BBT is a baseband signal and the RF input signal RFI is an RF signal. The RF modulator 32 modulates an RF carrier (not shown) using the baseband transmit signal BBT to provide the RF input signal RFI. In one embodiment of the RF modulator 32, the RF modulator 32 is a quadrature RF modulator. As such, in one embodiment of the baseband transmit signal BBT, the baseband transmit signal BBT is a quadrature baseband signal. In an alternate embodiment of the RF modulator 32, the RF modulator 32 is a polar RF modulator. As such, in one embodiment of the baseband transmit signal BBT, the baseband transmit signal BBT is a polar baseband signal.

Figure 3:
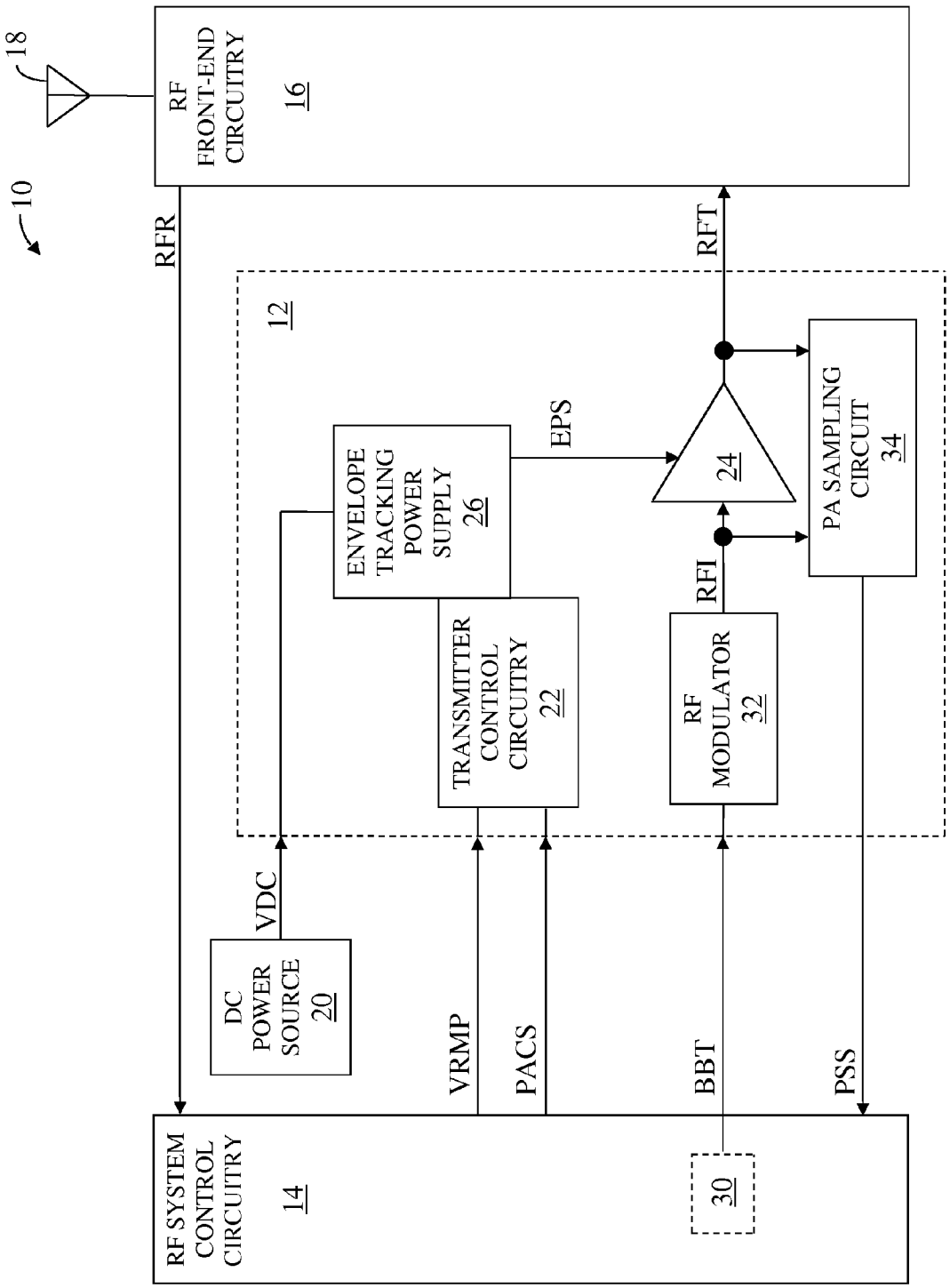
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 2, except in the RF communications system 10 illustrated in FIG. 3, the RF transmitter circuitry 12 further includes a PA sampling circuit 34, which samples the RF input signal RFI and the RF transmit signal RFT to provide a PA sampling signal PSS to the baseband PA predistortion module 30. In one embodiment of the PA sampling circuit 34, the PA sampling signal PSS is representative of distortion in the RF PA 24.

Figure 4:
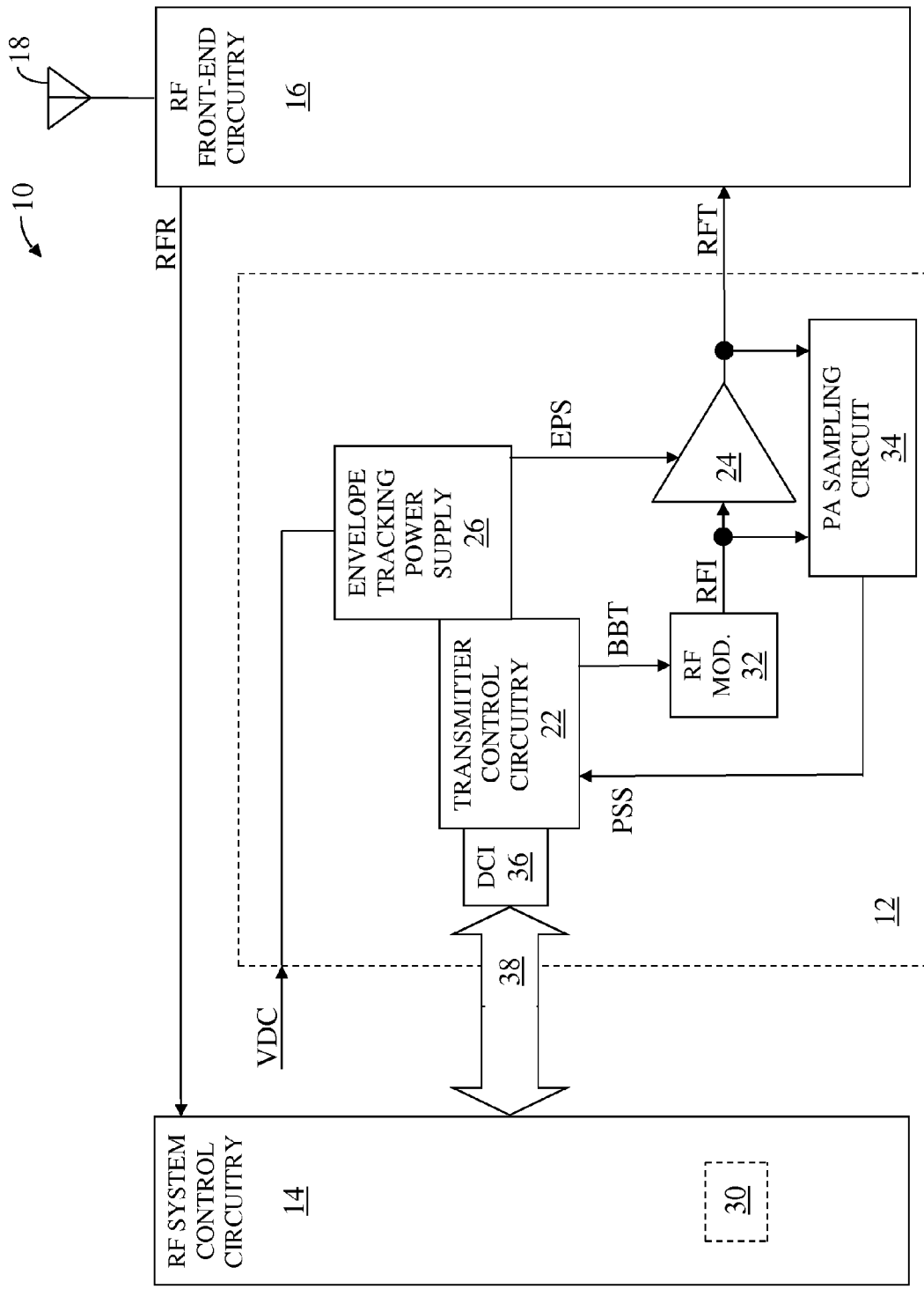
FIG. 4 shows the RF communications system according to another embodiment of the RF communications system.

FIG. 4 shows the RF communications system 10 according to another embodiment of the RF communications system 10. The RF communications system 10 illustrated in FIG. 4 is similar to the RF communications system 10 illustrated in FIG. 3; except in the RF communications system 10 illustrated in FIG. 4, the RF transmitter circuitry 12 further includes a digital communications interface 36, which is coupled between the transmitter control circuitry 22 and a digital communications bus 38. The digital communications bus 38 is also coupled to the RF system control circuitry 14.

In one embodiment of the RF communications system 10, the RF system control circuitry 14 provides the envelope power supply control signal VRMP (FIG. 1) and the transmitter configuration signal PACS (FIG. 1) to the transmitter control circuitry 22 via the digital communications bus 38 and the digital communications interface 36. In one embodiment of the RF communications system 10, the RF system control circuitry 14 provides the baseband transmit signal BBT (FIG. 2) to the RF modulator 32 via the digital communications bus 38, the digital communications interface 36, and the transmitter control circuitry 22. In one embodiment of the RF communications system 10, the baseband PA predistortion module 30 receives the PA sampling signal PSS (FIG. 3) from the PA sampling circuit 34 via the transmitter control circuitry 22, the digital communications interface 36, and the digital communications bus 38.

Figure 5:
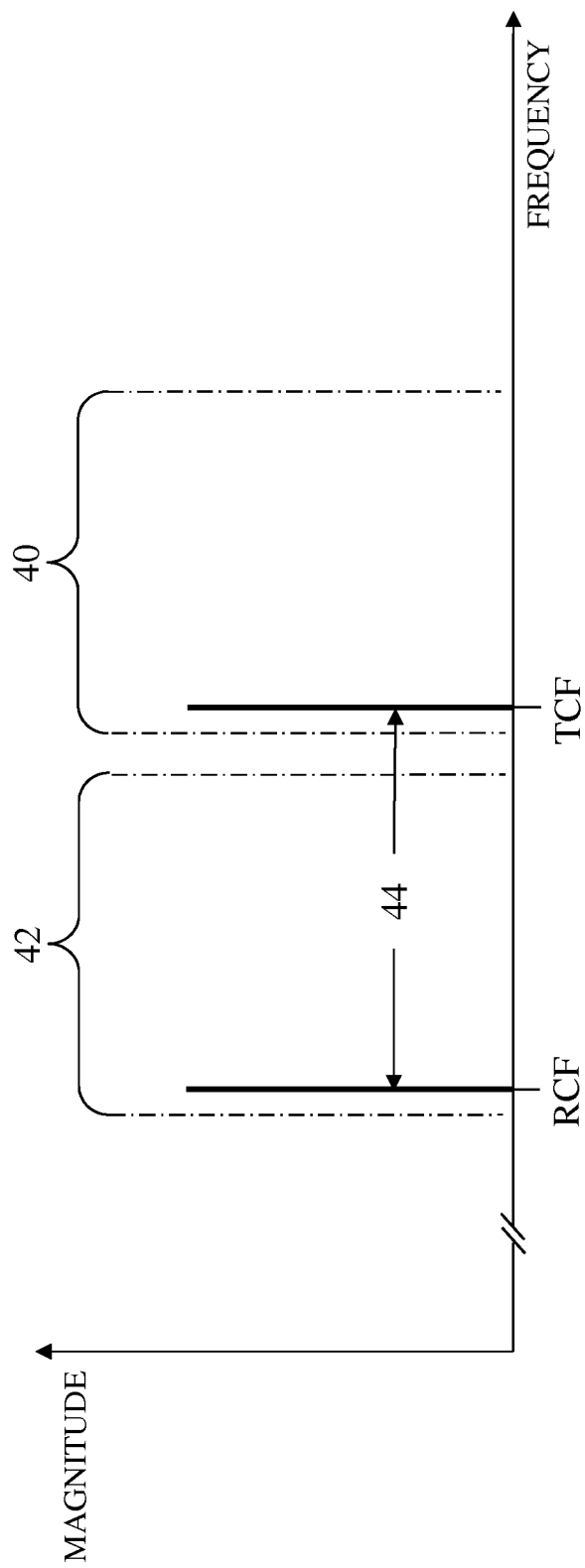
FIG. 5 is a graph illustrating characteristics of an RF transmit signal and an RF receive signal illustrated in FIG. 1 according to one embodiment of the RF transmit signal and the RF receive signal.

FIG. 5 is a graph illustrating characteristics of the RF transmit signal RFT and the RF receive signal RFR illustrated in FIG. 1 according to one embodiment of the RF transmit signal RFT and the RF receive signal RFR. In this embodiment of the RF transmit signal RFT and the RF receive signal RFR, the RF communications system 10 (FIG. 1) is capable of transmitting and receiving simultaneously. As such, the RF transmit signal RFT and the RF receive signal RFR are frequency division duplex (FDD) signals.

To avoid interfering with one another, the RF transmit signal RFT falls within a first RF communications band 40 and the RF receive signal RFR falls within a second RF communications band 42, such that the first RF communications band 40 and the second RF communications band 42 do not overlap. The RF transmit signal RFT has a transmit carrier frequency TCF and the RF receive signal RFR has a receive carrier frequency RCF. A difference between the transmit carrier frequency TCF and the receive carrier frequency RCF is a transmit/receive offset frequency 44.

In one embodiment of the RF transmit signal RFT and the RF receive signal RFR; to prevent the RF transmit signal RFT from interfering with the RF receive signal RFR, which is typically much weaker than the RF transmit signal RFT; the RF transmit signal RFT must have limited frequency content that would otherwise interfere with the RF receive signal RFR. Additionally, in one embodiment of the RF PA 24 (FIG. 1), the RF PA 24 (FIG. 1) operates in at least mild compression to increase efficiency. Such compression may introduce non-linearity into the RF PA 24 (FIG. 1), thereby creating spurious RF emissions that may interfere with the RF receive signal RFR. Emissions at the transmit/receive offset frequency 44 may be particularly problematic.

One technique for reducing spurious RF emissions from an RF PA operating in compression is to use predistortion of a baseband signal, which is used to modulate an RF input signal to the RF PA. However, modern communications protocols may use baseband signals with a high peak-to-average ratio. Further, since an RF receive signal is typically much weaker than an RF transmit signal, distortion products 100 dB or more below the RF transmit signal power level may cause interference with the RF receive signal. As a result, predistortion circuitry, which provides the predistortion, must have extremely high dynamic range to reduce interference with the RF receive signal. Also, a high peak-to-average ratio may require greater peak power capability from an RF modulator when using a predistorted baseband signal. However, even by meeting the above requirements, output spectrum may be reduced at some frequencies and increased at other frequencies.

Figure 6:
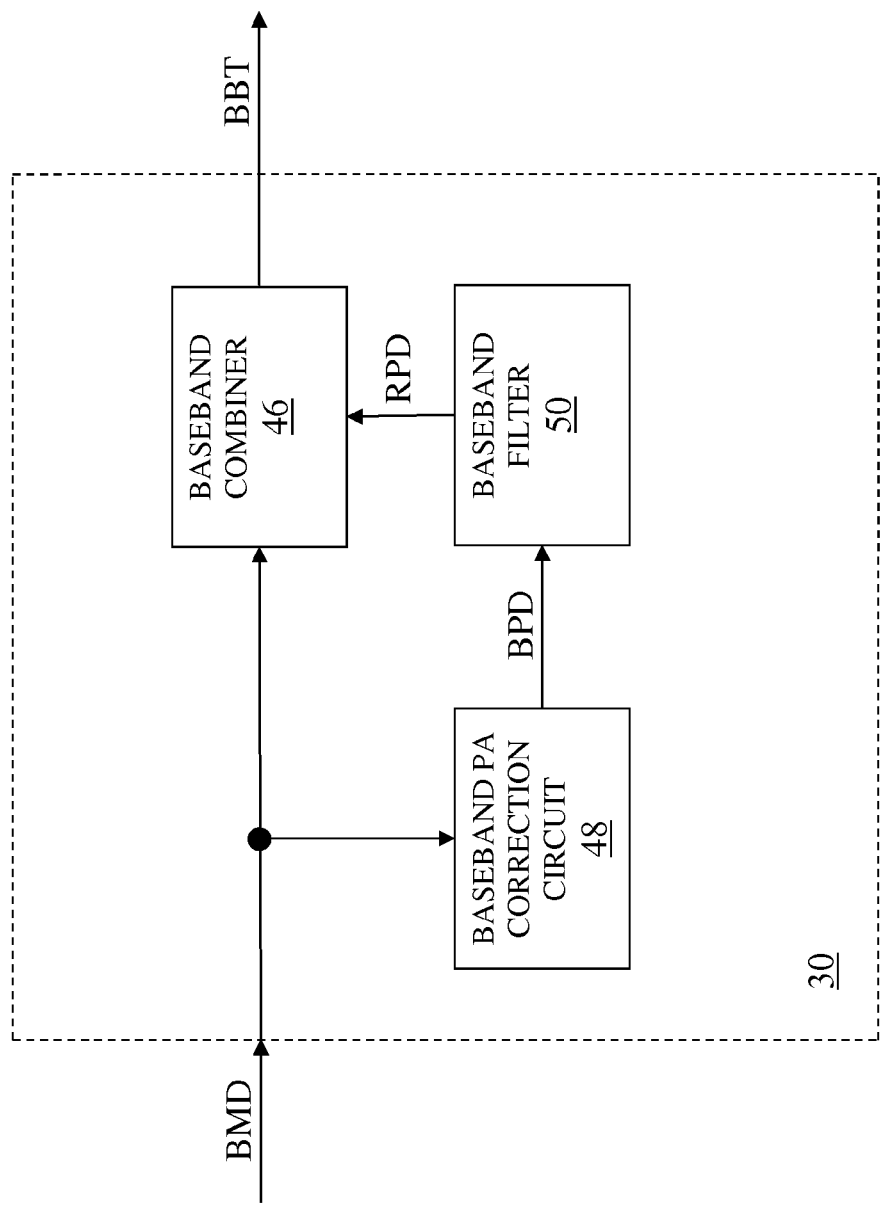
FIG. 6 shows details of a baseband PA predistortion module illustrated in FIG. 1 according to one embodiment of the baseband PA predistortion module.

FIG. 6 shows details of the baseband PA predistortion module 30 illustrated in FIG. 2 according to one embodiment of the baseband PA predistortion module 30. The baseband PA predistortion module 30 includes a baseband combiner 46, a baseband PA correction circuit 48, and a baseband filter 50. The baseband PA correction circuit 48 is representative of the RF PA 24, such that the baseband PA correction circuit 48 replicates behavior, which includes distortion, of the RF PA 24. The baseband PA correction circuit 48 receives and processes a modulation data signal BMD to provide a predistortion data signal BPD. The modulation data signal BMD is representative of the RF input signal RFI and the predistortion data signal BPD is representative of a correction needed at an output of the RF PA 24 if the RF PA 24 is uncorrected for distortion. If the RF PA 24 is uncorrected for distortion, then the RF PA 24 has distortion.

The baseband filter 50 receives and filters the predistortion data signal BPD to provide a reduced predistortion data signal RPD, such that a low frequency content of the reduced predistortion data signal RPD is less than a low frequency content of the predistortion data signal BPD. The baseband combiner 46 receives and combines the modulation data signal BMD and the reduced predistortion data signal RPD to provide the baseband transmit signal BBT.

In one embodiment of the baseband filter 50, by reducing the low frequency content of the reduced predistortion data signal RPD, an output spectrum of the RF transmit signal RFT (FIG. 2) is reduced at frequencies of interest and is substantially unchanged at other frequencies. In this regard, the predistortion provided by the baseband PA predistortion module 30 is frequency selective predistortion. In traditional predistortion systems (not shown), a peak-to-average ratio of traditional predistorted modulation data is significantly higher than a peak-to-average ratio of traditional modulation data. However, in one embodiment of the baseband PA predistortion module 30, the baseband filter 50 does not significantly modify a peak-to-average ratio of the modulation data signal BMD, such that the peak-to-average ratio of the modulation data signal BMD is about equal to a peak-to-average ratio of the baseband transmit signal BBT. In this regard, a dynamic range of the baseband PA predistortion module 30 may be significantly less than a dynamic range of traditional predistortion systems (not shown).

In one embodiment of the baseband filter 50, the baseband filter 50 is a high pass filter. In one embodiment of the baseband filter 50, the baseband filter 50 is a raised cosine high pass filter. In one embodiment of the baseband filter 50, a group delay of the baseband filter 50 is about flat between a break frequency of the baseband filter 50 and about a maximum frequency of the modulation data signal BMD. In one embodiment of the baseband filter 50, the break frequency of the baseband filter 50 is based on the transmit/receive offset frequency 44 (FIG. 5). In one embodiment of the baseband filter 50, the break frequency of the baseband filter 50 is equal to about one-half times the transmit/receive offset frequency 44 (FIG. 5). In one embodiment of the baseband filter 50, the break frequency of the baseband filter 50 is based on a bandwidth of the modulation data signal BMD.

In one embodiment of the baseband combiner 46, the baseband combiner 46 includes analog circuitry, digital circuitry, computer circuitry executing instructions, computer memory, ADC circuitry, DAC circuitry, the like, or any combination thereof. In one embodiment of the baseband PA correction circuit 48, the baseband PA correction circuit 48 includes analog circuitry, digital circuitry, computer circuitry executing instructions, computer memory, ADC circuitry, DAC circuitry, the like, or any combination thereof. In one embodiment of the baseband filter 50, the baseband filter 50 includes analog circuitry, digital circuitry, computer circuitry executing instructions, computer memory, ADC circuitry, DAC circuitry, the like, or any combination thereof.

In one embodiment of the modulation data signal BMD, the modulation data signal BMD is represented by at least one analog signal, at least one digital signal, at least one computer memory location, the like, or any combination thereof. In one embodiment of the predistortion data signal BPD, the predistortion data signal BPD is represented by at least one analog signal, at least one digital signal, at least one computer memory location, the like, or any combination thereof. In one embodiment of the reduced predistortion data signal RPD, the reduced predistortion data signal RPD is represented by at least one analog signal, at least one digital signal, at least one computer memory location, the like, or any combination thereof.

In one embodiment of the modulation data signal BMD, the modulation data signal BMD is a quadrature data signal, a polar data signal, the like, or any combination thereof. In one embodiment of the predistortion data signal BPD, the predistortion data signal BPD is a quadrature data signal, a polar data signal, the like, or any combination thereof. In one embodiment of the reduced predistortion data signal RPD, the reduced predistortion data signal RPD is a quadrature data signal, a polar data signal, the like, or any combination thereof.

In a first exemplary embodiment of the baseband combiner 46, the baseband combiner 46 includes analog circuitry. In a second exemplary embodiment of the baseband combiner 46, the baseband combiner 46 includes digital processing circuitry. In a first exemplary embodiment of the baseband PA correction circuit 48, the baseband PA correction circuit 48 includes analog circuitry. In a second exemplary embodiment of the baseband PA correction circuit 48, the baseband PA correction circuit 48 includes digital processing circuitry. In a first exemplary embodiment of the baseband filter 50, the baseband filter 50 includes analog circuitry. In a second exemplary embodiment of the baseband filter 50, the baseband filter 50 includes digital processing circuitry.

Figure 7:
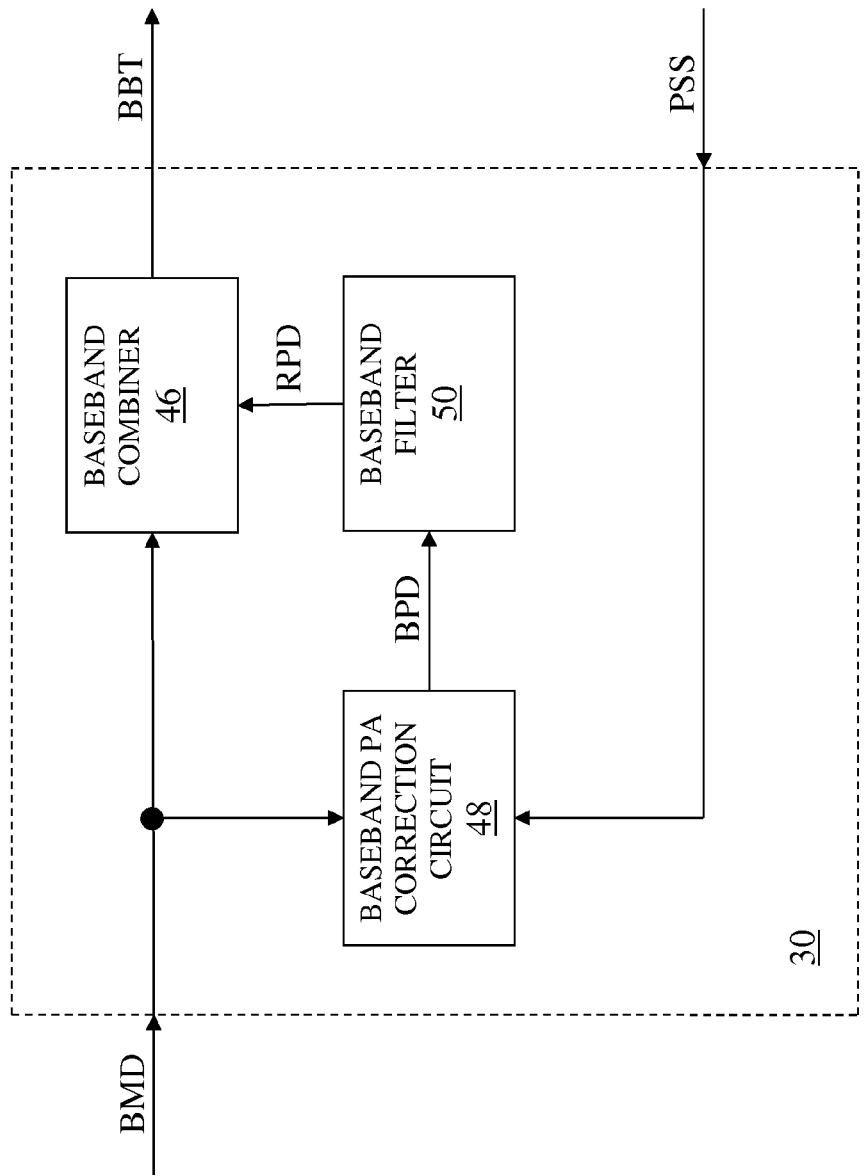
FIG. 7 shows details of the baseband PA predistortion module illustrated in FIG. 3 according to an alternate embodiment of the baseband PA predistortion module.

FIG. 7 shows details of the baseband PA predistortion module 30 illustrated in FIG. 3 according to an alternate embodiment of the baseband PA predistortion module 30. The baseband PA predistortion module 30 illustrated in FIG. 7 is similar to the baseband PA predistortion module 30 illustrated in FIG. 6, except in the baseband PA predistortion module 30 illustrated in FIG. 7, the baseband PA correction circuit 48 receives the PA sampling signal PSS. Since the PA sampling signal PSS is based on actual measurements of the RF PA 24 (FIG. 3), the baseband PA correction circuit 48 may improve accuracy of the predistortion data signal BPD using the PA sampling signal PSS. In one embodiment of the PA sampling signal PSS, the PA sampling signal PSS is a polar baseband signal. In an alternate embodiment of the PA sampling signal PSS, the PA sampling signal PSS is a quadrature baseband signal.

Figure 8:
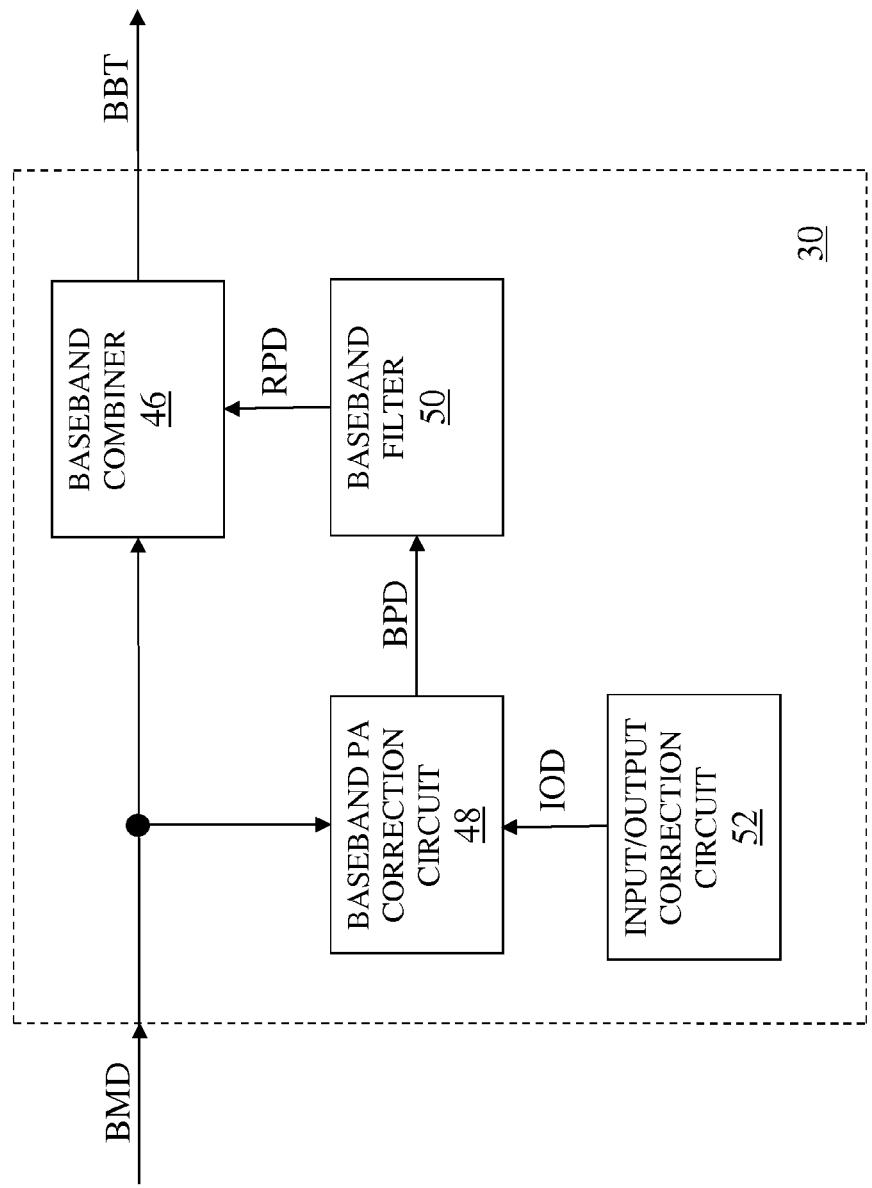
FIG. 8 shows details of the baseband PA predistortion module illustrated in FIG. 1 according to an additional embodiment of the baseband PA predistortion module.

FIG. 8 shows details of the baseband PA predistortion module 30 illustrated in FIG. 1 according to an additional embodiment of the baseband PA predistortion module 30. The baseband PA predistortion module 30 illustrated in FIG. 8 is similar to the baseband PA predistortion module 30 illustrated in FIG. 6, except in the baseband PA predistortion module 30 illustrated in FIG. 8, the baseband PA predistortion module 30 further includes an input/output correction circuit 52. In one embodiment of the baseband PA correction circuit 48, the baseband PA correction circuit 48 provides the predistortion data signal BPD, such that the predistortion data signal BPD is representative of distortion at an output of the RF PA 24 (FIG. 3). However, since the predistortion correction is applied to the baseband transmit signal BBT, the predistortion correction is applied to an input of the RF PA 24 (FIG. 3) and not to the output of the RF PA 24 (FIG. 3). As a result, the effects of the predistortion correction may be distorted by the RF PA 24 (FIG. 3).

The input/output correction circuit 52 provides a correction data signal IOD to the baseband PA correction circuit 48. The baseband PA correction circuit 48 uses the correction data signal IOD to compensate for predistortion correction being applied to the input to the RF PA 24 instead of to the output of the RF PA 24. In one embodiment of the input/output correction circuit 52, the input/output correction circuit 52 includes analog circuitry, digital circuitry, computer circuitry executing instructions, computer memory, ADC circuitry, DAC circuitry, the like, or any combination thereof. In one embodiment of the correction data signal IOD, the correction data signal IOD is a quadrature data signal, a polar data signal, the like, or any combination thereof. In a first exemplary embodiment of the input/output correction circuit 52, the input/output correction circuit 52 includes analog circuitry. In a second exemplary embodiment of the input/output correction circuit 52, the input/output correction circuit 52 includes digital processing circuitry.

Figure 9:
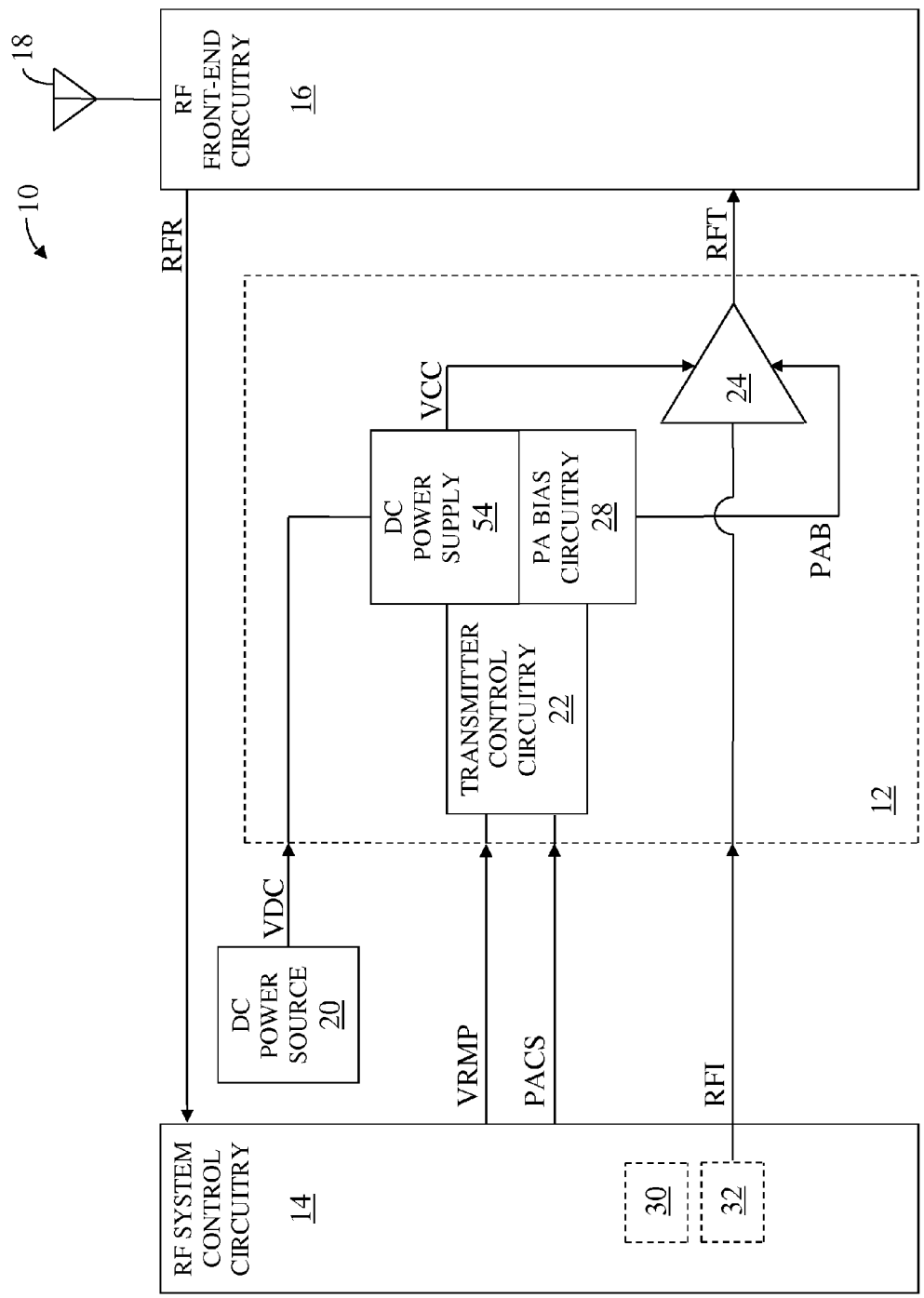
FIG. 9 shows the RF communications system according to a further embodiment of the RF communications system.

FIG. 9 shows the RF communications system 10 according to a further embodiment of the RF communications system 10. The RF communications system 10 illustrated in FIG. 10 is similar to the RF communications system 10 illustrated in FIG. 1, except in the RF communications system 10 illustrated in FIG. 10 the envelope tracking power supply 26 is replaced with a DC power supply 54.

The DC power supply 54 provides a DC power supply signal VCC to the RF PA 24 instead of the envelope tracking power supply 26 providing the envelope power supply signal EPS to the RF PA 24. The DC power supply 54 uses the DC source signal VDC to provide the DC power supply signal VCC. The RF PA 24 uses the DC power supply signal VCC, which provides power for amplification. The DC power supply signal VCC provides a substantially constant voltage and does not provide envelope tracking.

Figure 10:
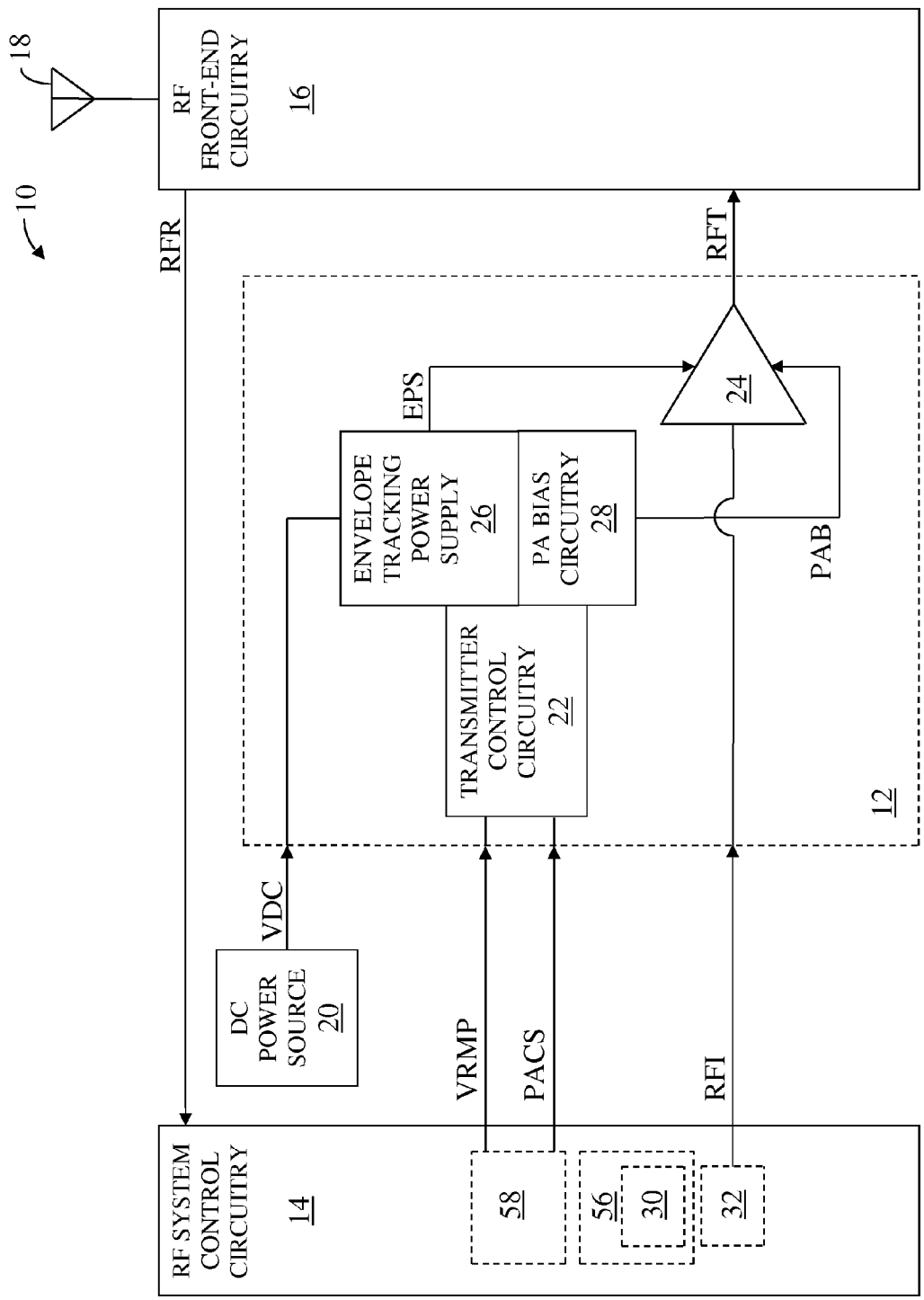
FIG. 10 shows the RF communications system according to one embodiment of the RF communications system.

FIG. 10 shows the RF communications system 10 according to one embodiment of the RF communications system 10. The RF communications system 10 illustrated in FIG. 10 is similar to the RF communications system 10 illustrated in FIG. 1, except in the RF communications system 10 illustrated in FIG. 10, the RF system control circuitry 14 further includes first digital signal processing circuitry 56 and second digital signal processing circuitry 58.

The first digital signal processing circuitry 56 includes the baseband PA predistortion module 30. In one embodiment of the first digital signal processing circuitry 56, the first digital signal processing circuitry 56 includes memory and executes multiple software instructions, such that the baseband combiner 46 is a software combiner, the baseband PA correction circuit 48 is a software correction circuit, the baseband filter 50 is a software baseband filter, or any combination thereof.

Additionally, in one embodiment of the first digital signal processing circuitry 56, at least one memory location in the first digital signal processing circuitry 56 is representative of the modulation data signal BMD, at least one memory location in the first digital signal processing circuitry 56 is representative of the predistortion data signal BPD, and at least one memory location in the first digital signal processing circuitry 56 is representative of the reduced predistortion data signal RPD. The second digital signal processing circuitry 58 provides the envelope power supply control signal VRMP and the transmitter configuration signal PACS.

Figure 11:
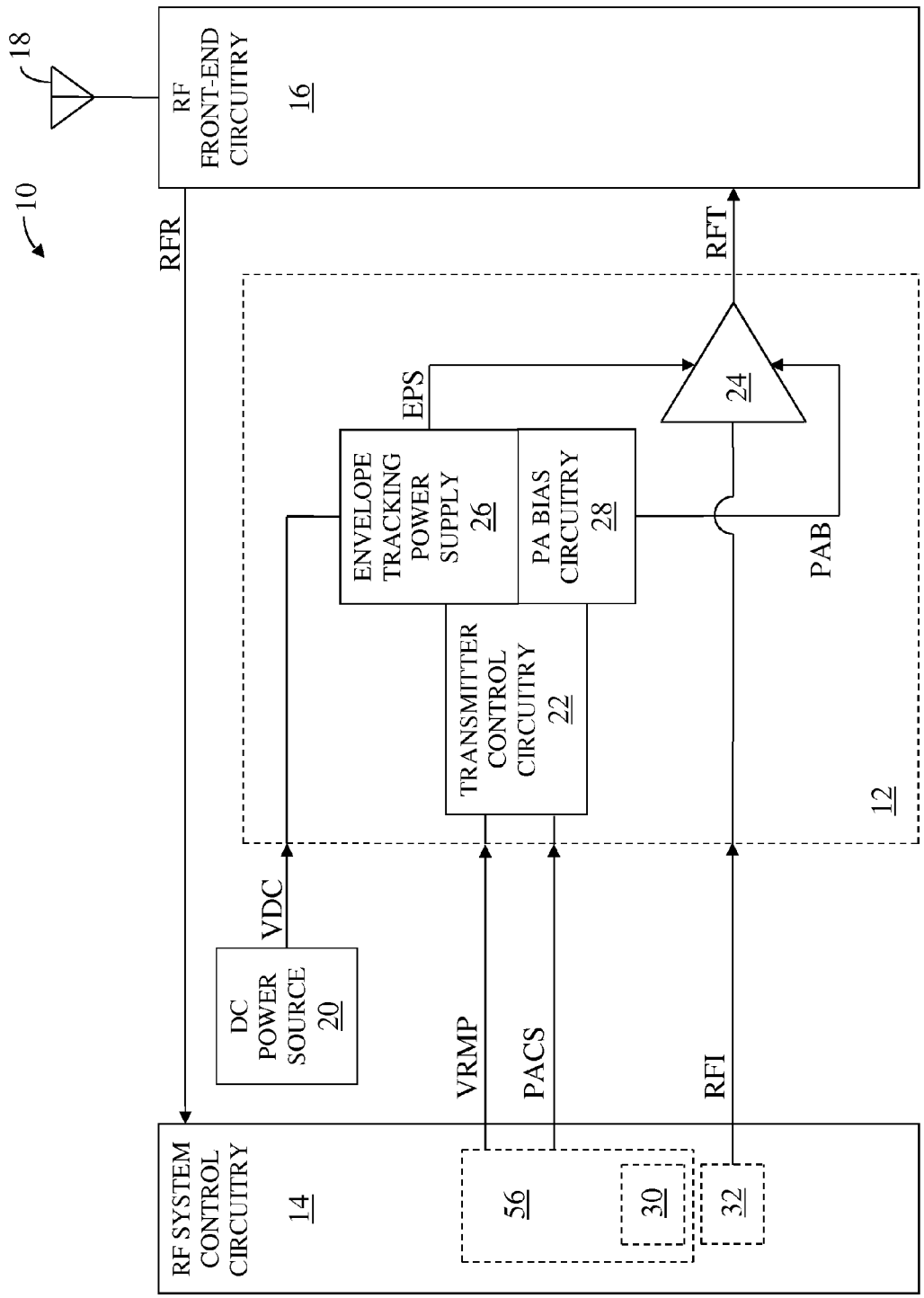
FIG. 11 shows the RF communications system according to an alternate embodiment of the RF communications system.

FIG. 11 shows the RF communications system 10 according to an alternate embodiment of the RF communications system 10. The RF communications system 10 illustrated in FIG. 11 is similar to the RF communications system 10 illustrated in FIG. 10, except in the RF communications system 10 illustrated in FIG. 11, the second digital signal processing circuitry 58 is omitted. As such, the first digital signal processing circuitry 56 provides the envelope power supply control signal VRMP and the transmitter configuration signal PACS.

Those skilled in the art will recognize improvements and modifications to the embodiments of the present disclosure. All such improvements and modifications are considered within the scope of the concepts disclosed herein and the claims that follow.

What is claimed is:

1. The radio frequency (RF) system control circuitry comprising a baseband power amplifier (PA) predistortion module, which comprises:
   a baseband PA correction circuit configured to replicate behavior of an RF PA by processing a modulation data signal to provide a predistortion data signal, wherein:
      the behavior of the RF PA includes distortion; and
      the modulation data signal is representative of an RF input signal to the RF PA; and
      the predistortion data signal is representative of a correction needed at an output of the RF PA;
   a high pass baseband filter configured to receive and filter the predistortion data signal to provide a reduced predistortion data signal, wherein a low frequency content of the reduced predistortion data signal is less than a low frequency content of the predistortion data signal, and a break frequency of the high pass baseband filter is based on a transmit/receive offset frequency; and a baseband combiner configured to receive and combine the modulation data signal and the reduced predistortion data signal to provide a baseband transmit signal.

2. The RF system control circuitry of claim 1 wherein an RF modulator is configured to modulate an RF carrier using the baseband transmit signal to provide the RF input signal.

3. The RF system control circuitry of claim 2 further comprising the RF modulator.

4. The RF system control circuitry of claim 3 wherein the RF system control circuitry is configured to receive an RF receive signal.

5. The RF system control circuitry of claim 2 wherein the RF modulator is a quadrature RF modulator.

6. The RF system control circuitry of claim 2 wherein the RF modulator is a polar RF modulator.

7. The RF system control circuitry of claim 2 wherein the RF modulator is configured to receive the baseband transmit signal via a digital communications interface.

8. The RF system control circuitry of claim 1 wherein a peak-to-average ratio of the baseband transmit signal is essentially equal to a peak-to-average ratio of the modulation data signal.

9. The RF system control circuitry of claim 1 wherein the RF PA is configured to receive and amplify the RF input signal to provide an RF transmit signal using an envelope power supply signal.

10. The RF system control circuitry of claim 1 wherein the RF PA is configured to receive and amplify the RF input signal to provide an RF transmit signal.

11. The RF system control circuitry of claim 10 wherein the RF transmit signal has a transmit carrier frequency and an RF receive signal has a receive carrier frequency, such that a transmit/receive offset frequency is essentially equal to a difference between the transmit carrier frequency and the receive carrier frequency.

12. The RF system control circuitry of claim 1 wherein the high pass baseband filter is a raised cosine high pass filter.

13. The RF system control circuitry of claim 1 wherein a group delay of the high pass baseband filter is essentially flat between a break frequency of the high pass baseband filter and a maximum frequency of the modulation data signal.

14. The RF system control circuitry of claim 1 wherein the break frequency of the high pass baseband filter is equal to essentially one-half times the transmit/receive offset frequency.

15. The RF system control circuitry of claim 1 wherein the break frequency of the high pass baseband filter is further based on a bandwidth of the modulation data signal.

16. The RF system control circuitry of claim 1 wherein the baseband PA correction circuit is further configured to improve accuracy of the predistortion data signal using a PA sampling signal.

17. The RF system control circuitry of claim 1 further comprising an input/output correction circuit configured to provide a correction data signal to the baseband PA correction circuit, which is further configured to use the correction data signal to compensate for predistortion correction being applied to an input of the RF PA instead of to the output of the RF PA.

18. A method comprising:
replicating behavior of an radio frequency power amplifier (RF PA) by processing a modulation data signal to provide a predistortion data signal, wherein:
the behavior of the RF PA includes distortion;
the modulation data signal is representative of an RF input signal to an RF PA; and
the predistortion data signal is representative of a correction needed at an output of the RF PA;
receiving and high pass filtering the predistortion data signal to provide a reduced predistortion data signal, wherein a low frequency content of the reduced predistortion data signal is less than a low frequency content of the predistortion data signal, such that a break frequency of the high pass filtering is based on a transmit/receive offset frequency; and
receiving and combining the modulation data signal and the reduced predistortion data signal to provide a baseband transmit signal.

\* \* \* \* \*